(12) United States Patent
Lhospitalier

(10) Patent No.: US 9,211,766 B2
(45) Date of Patent: Dec. 15, 2015

(54) METHOD OF DESIGNING A TIRE, AND TIRE

(75) Inventor: Sylvie Lhospitalier, Ennezat (FR)

(73) Assignees: COMPAGNIE GENERALE DES ESTABLISSEMENTS MICHELIN, Clermont-Ferrand (FR); MICHELIN RECHERCHE ET TECHNIQUE S.A., Granges-Paccot (CH)

( * ) Notice: Subject to any disclaimer, the term of this patent is extended or adjusted under 35 U.S.C. 154(b) by 482 days.

(21) Appl. No.: 13/511,522

(22) PCT Filed: Dec. 3, 2010

(86) PCT No.: PCT/EP2010/068888
§ 371 (c)(1),
(2), (4) Date: Jul. 12, 2012

(87) PCT Pub. No.: WO2011/069927
PCT Pub. Date: Jun. 16, 2011

(65) Prior Publication Data
US 2013/0139939 A1    Jun. 6, 2013

(30) Foreign Application Priority Data
Dec. 8, 2009  (FR) ...................................... 09 58728

(51) Int. Cl.
| | | |
|---|---|---|
| *G01M 17/02* | (2006.01) | |
| *B60C 11/04* | (2006.01) | |
| *B60C 11/03* | (2006.01) | |
| *B60C 99/00* | (2006.01) | |
| *G06F 17/50* | (2006.01) | |

(52) U.S. Cl.
CPC ............. *B60C 11/04* (2013.01); *B60C 11/0306* (2013.04); *B60C 11/0309* (2013.04); *B60C 99/006* (2013.04); *G06F 17/5009* (2013.01); *G01M 17/02* (2013.01)

(58) Field of Classification Search
None
See application file for complete search history.

(56) References Cited

U.S. PATENT DOCUMENTS

2004/0211501 A1   10/2004  Kajita
2007/0151643 A1    7/2007  Takahashi

FOREIGN PATENT DOCUMENTS

| | | |
|---|---|---|
| EP | 1 440 822 A1 | 7/2004 |
| WO | WO 2009/048078 A1 | 4/2009 |
| WO | WO 2009/128098 A1 | 10/2009 |

OTHER PUBLICATIONS

International Search Report (PCT/ISA/210) issued on Jan. 21, 2011, by the European Patent Office as the International Searching Authority for International Application No. PCT/EP2010/068888.

*Primary Examiner* — Andre Allen
(74) *Attorney, Agent, or Firm* — Dickinson Wright PLLC

(57) ABSTRACT

Method of designing a tire for the steered axle of a heavy goods vehicle, having a nominal sidewall height F, having a tread in the new state having a maximum total width Lo for maximum contact with the ground and provided with at least four circumferential grooves each extending between the tread surface and a groove bottom, these grooves delimiting three intermediate ribs and two edge ribs axially bounding the tread, each edge rib having two lateral walls, one of which, known as the internal lateral wall, having a height PREp measured with respect to the bottom of the groove delimiting the edge rib, this internal lateral wall having, when viewed in section on a plane containing the axis of rotation, an inclination DEp, each edge rib having a width LEp greater than the width of each of the intermediate ribs, by iteratively determining values for the dimensions LEp, PREp and DEp that satisfy the following relationship:

$P(LEp, DEp, PREp) < 1.105769231 \times F$, with $P(LEp, DEp, PREp) = -303.528 - 2.00675 \times LEp + 10.2755 \times DEp + 81.0414 \times PREp - 0.052551 \times LEp^2 - 0.0825991 \times LEp \times DEp + 0.225564 \times LEp \times PREp - 0.111262 \times DEp^2 - 0.209215 \times DEp \times PREp - 2.5831 \times PREp^2$.

Also, the tire having edge rib widths and lateral wall angles thus determined.

7 Claims, 2 Drawing Sheets

METHOD OF DESIGNING A TIRE, AND TIRE

The invention relates to tires for heavy goods vehicles and more particularly to tires intended to be fitted to the steered axles of these vehicles.

A tire for a vehicle carrying heavy loads comprises a tread intended during running to provide contact between the tire and the road surface and to transmit loads in the direction of running (motive or braking loads) and in a direction transverse to the direction of running (cornering loads). This tread is provided with a plurality of hollows in the form of grooves and/or incisions to improve the running conditions when the road surface is covered with water or with snow. These grooves delimit raised elements (ribs or blocks) distributed over the tread; a distinction is made between the edge parts that axially delimit the tread and the intermediate parts situated axially between these edge parts.

Moreover, in addition to a tread a tire comprises beads intended to be in contact with a mounting rim, a sidewall connecting each bead to a crown region, the latter being capped by the tread. The entire tire is reinforced by a carcass reinforcement anchored at its two ends into the beads and extending through the sidewalls and into the crown region. Radially between the carcass reinforcement and the tread there is a crown reinforcement. The carcass reinforcement is said to be radial if its reinforcers are directed in a direction that makes an angle greater than or equal to 80 degrees with a direction tangential to the circumferential direction.

Definitions

A radial direction in this document means a direction which is perpendicular to the axis of rotation of the tire (this direction corresponds to the direction of the thickness of the tread).

An axial direction means a direction parallel to the axis of rotation of the tire.

Circumferential direction means a direction which is perpendicular both to the axial direction and to a radial direction.

Axially towards the outside means a direction which is orientated towards the outside of the internal cavity of the tire.

Equatorial plane: plane perpendicular to the axis of rotation and passing through the axially outermost points of the tire, this equatorial plane virtually dividing the tire into two substantially equal halves.

The loading conditions endured by a tire differ according to the position in which the tire is mounted on a heavy goods vehicle, and this is why attempts to suit a specific tire to each axle are made.

If tires fitted on a steered axle are examined, it is found that uneven wear (known as "tramlining wear") can arise, this being manifested axially on the outside of the edge parts. Uneven wear here means wear that is more pronounced in one localized region of a raised element of the tread. In the case of tramlining wear, it is the region axially outermost of the raised elements of the edge part of the tread which wear more quickly than the remainder of the contact face of these elements. This uneven wear may cause vibration in the vehicle and therefore encourage the user to remove his tires prematurely in order to renew the tread or change the tire.

This problem has already been the subject of a proposed solution and in particular it has been proposed that a small rib (called a "sacrificial rib") which has suitable dimensions for somewhat taking all of the uneven wear upon itself be added axially on the outside of the edge parts. This solution by displacing the uneven wear ensures even and therefore uniform wear across the entire edge part adjacent to the sacrificial rib.

This solution does, however, have its limits for tires which in use may be subjected to very high stress regimes, therefore causing material to be torn out of the sacrificial rib. This has the effect of rendering the sacrificial rib ineffective against uneven wear, and also of reducing the overall endurance of the tire if some of this tearing spreads into a sidewall of the tire.

The objective of the invention is to solve both this problem of uneven wear of tires fitted to a steered axle while at the same time avoiding proneness to tearing under particularly arduous conditions of use.

The subject of the invention relates to a tread for a tire of a heavy goods vehicle that meets the aforementioned objective and a method of designing such a tire.

Proposed here is a method of designing a tire intended to be fitted to the steered axle of a heavy goods vehicle, this tire comprising beads intended to be in contact with a rim on which the tire is mounted, these beads being extended by sidewalls, the latter meeting in a crown region itself surmounted by a tread intended to come into contact with the road surface during running, the tire having a nominal sidewall height F, the crown reinforcement comprising at least two superposed reinforcer plies, the tread in the new state having a width Lo for maximum contact with the ground and being provided with at least four circumferential grooves each having a width and each extending between the tread surface of the tread and a groove bottom, these grooves delimiting three intermediate ribs and two edge ribs axially bounding the said tread, each edge rib having two lateral walls, one of these lateral walls, known as the internal lateral wall, having a height $PEp$ measured with respect to the bottom of the groove delimiting the said edge rib, this internal lateral wall having, when viewed in section on a plane containing the axis of rotation, an inclination $DEp$, each edge rib having a width $LEp$ greater than the width of each of the intermediate ribs. This design method involves iteratively determining values for the dimensions $LEp$, $PEp$ and $DEp$ that satisfy the following relationship:

$$P(LEp, DEp, PREp) < 1.105769231 \times F, \text{ (× representing the multiplication operation)}$$

where the value of $P(LEp, DEp, PREp)$ is obtained by making the following calculation:

$$P(LEp, DEp, PREp) =$$
$$-303.528 - 2.00675 \times LEp + 10.2755 \times DEp + 81.0414 \times PREp -$$
$$0.052551 \times LEp^2 - 0.0825991 \times LEp \times DEp + 0.225564 \times LEp \times PREp -$$
$$0.111262 \times DEp^2 - 0.209215 \times DEp \times PREp - 2.5831 \times PREp^2,$$

the lengths $LEp$ and $PREp$ being expressed in millimeters (mm), and the angle $DEp$ in degrees (°).

Thanks to the design method according to the invention it is possible to obtain a tire the tread of which offers lasting performance, which means performance that is maintained irrespective of the degree to which this tread is worn. The present invention also provides control over the thermal heating in the edge regions of the tread.

In the expression used to implement the method according to the invention, the height F of the sidewall of a tire is calculated using the following formula:

$$F = \text{ROUNDED}[(\text{maximum axial width of the tire} \times H/S)/100 - Hc]$$

in which H/S represents the aspect ratio of the tire and Hc is equal to the height of rim flange which height is for a tire of the "drop center" type equal to 12.7 mm.

ROUNDED means a function the result of which is the integer value below a number of which the fractional/decimal part is at most equal to 0.5 and which yields the integer value above a number if the fractional/decimal part thereof is greater than 0.5. For example: ROUNDED(2.4) equals 2 and ROUNDED(2.6) equals 3.

Advantageously, the design method is such that for each intermediate rib, the difference between the depths of two grooves delimiting one and the same rib is small, i.e. this difference is at most equal to 10% of the larger of the depths of these grooves.

Advantageously, the design method is applied to the case in which the edge rib and the immediately adjacent intermediate rib have different heights and are such that the difference between these heights is at most equal to 15% of the shorter of these heights.

Advantageously, the design method is applied to the case in which the angle DEp of the internal lateral wall of each edge rib with a radial direction is chosen to be at most equal to 26 degrees, and the angle of the lateral wall opposite in the same groove is chosen to be at most equal to 20 degrees. More advantageously still in the latter instance, the design method is applied to the case where the width of each edge rib Lep is chosen so as to be at least 1.85 times greater than the width of any other intermediate rib. More preferably still, the angle DEp of the internal lateral wall of each edge rib with a radial direction is chosen in an interval ranging from 10 degrees to 26 degrees, the angle of the lateral wall opposite in the same groove being chosen to be at most equal to 20 degrees.

To implement the method according to the invention, it is preferable to choose a first triplet of values for LEp, PREp and DEp and then, if the relationship P(LEp, DEp, PREp) <1.105769231×F is not satisfied, first of all to increase the value of the width LEp of the shoulder rib, then to decrease the height PREp of the internal lateral wall and finally to increase the value of the angle DEp of the internal lateral wall.

The invention also relates to a tire obtained using the method according to the invention.

Thus there is proposed a tire intended to be fitted to the steered axle of a heavy goods vehicle, this tire comprising beads intended to be in contact with a rim on which the tire is mounted, these beads being extended by sidewalls, the latter meeting in a crown region itself surmounted by a tread intended to come into contact with the road surface during running, the tire having a nominal sidewall height F, a crown reinforcement comprising at least two superposed reinforcer plies, the tread in the new state having a maximum width Lo for contact with the ground under conventional conditions of use and, this tread being provided with at least four circumferential grooves each having a width and each extending between the tread surface of the tread and a groove bottom, these grooves delimiting three intermediate ribs and two edge ribs axially bounding the said tread, each edge rib having two lateral walls, one of these lateral walls, known as the internal lateral wall, having a height PREp measured with respect to the bottom of the groove delimiting the said edge rib, this internal lateral wall having, when viewed in section on a plane containing the axis of rotation, an inclination DEp, this angle being such that the points of this lateral wall that are radially furthest inwards are closer to the equatorial plane of the tire than the points of the same lateral wall that are radially outermost, each edge rib having a width LEp greater than the width of each of the intermediate ribs, an equatorial plane perpendicular to the axis of rotation of the tire and passing through the points of the tire that are radially furthest away from the axis of rotation, this tire being characterized in that the width of the edge rib LEp, the angle of the lateral wall of an edge rib DEp, and the height PREp of the internal lateral wall of the edge rib satisfy the following relationship:

$$P(LEp, DEp, PREp) < 1.105769231 \times F$$

where the value of P(LEp, DEp, PREp) is obtained by making the following calculation:

$$P(LEp, DEp, PREp) = \\ -303.528 - 2.00675 \times LEp + 10.2755 \times DEp + 81.0414 \times PREp - \\ 0.052511 \times LEp^2 - 0.0825991 \times LEp \times DEp + 0.225564 \times LEp \times PREp - \\ 0.111262 \times DEp^2 - 0.209215 \times DEp \times PREp - 2.5831 \times PREp^2.$$

Advantageously, and in combination with the use of the design method according to the invention, the tire according to the invention comprising a crown reinforcement under the tread, this crown reinforcement comprising a plurality of superposed plies of reinforcers is such that the end of the axially widest crown ply is situated, with respect to the equatorial plane of the tire, axially at a distance greater than the axial distance of the axially outermost groove. Thus, this widest crown ply is present radially under the shoulder rib over a distance at least equal to 75% of the total width LEp of this shoulder rib.

Advantageously, the tire according to the invention is such that the width of each groove, measured on the tread surface in the new state, is at least equal to 3% of the total width Lo of the tread.

It is preferable for the angle of inclination DEp of the internal lateral wall of the edge rib and the angle of inclination of the wall opposite this internal lateral wall to be such that the sum of these two angles is greater than or equal to 26 degrees.

More preferably still, the angle of inclination DEp of the internal lateral wall of the edge rib varies continuously from a minimum value that satisfies the relationship P(LEp, DEp, PREp)<1.105769231×F, this value always remaining greater than or equal to 10 degrees.

Thanks to this invention it is thus possible to increase by 20% the amount of distance covered before the onset of "tramlining" wear appears by comparison with a conventional design (which means one that does not have a sacrificial rib); it is furthermore possible to push back by around 40% the amount of distance covered before problems (such as vibrations) connected with uneven wear at the edges of the tread begin to appear.

In certain applications of the invention to tires running on road surfaces that may be stony, it may be necessary to have protrusions in the grooves delimited by the edge ribs in order to protect the bottoms of the said grooves. In such cases, the angle of inclination DEp of the internal lateral wall of the edge rib is preferably limited to at most 6 degrees, this being so that these protrusions are not weakened. The protrusions concerned may be circumferentially continuous or alternatively may be discontinuous. They preferably have a height at least equal to 50% of the height PREp of the internal lateral wall of the edge rib and a width at least equal to half the width of the groove in which they are formed.

Other features and advantages of the invention will become apparent from the description given hereinafter with reference to the attached figures which, by way of nonlimiting example, show one embodiment of the subject matter of the invention:

Figure 1:
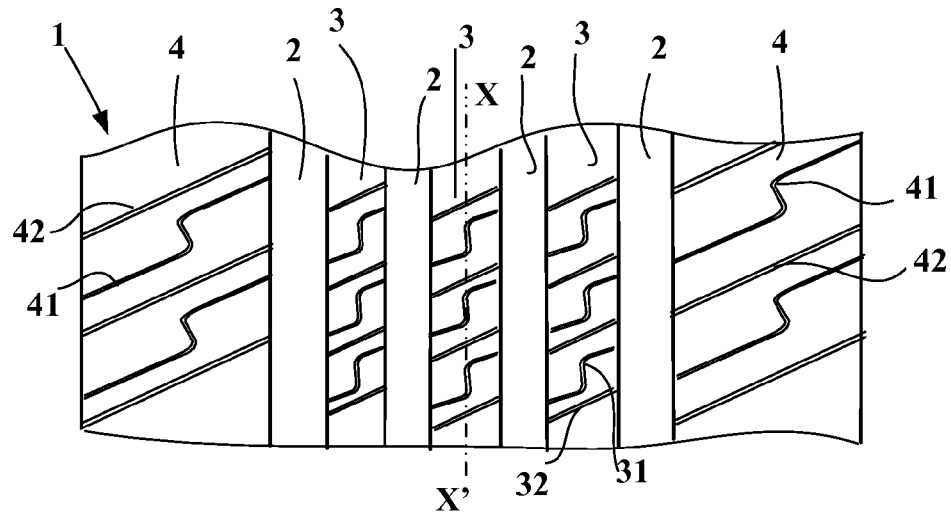
FIG. 1 is a plan view of part of the tread.

FIG. 1 is a plan view of part of the tread 1 built according to the invention for a tire intended to be fitted to the steered axle of a heavy goods vehicle. This tread comprises four circumferentially oriented grooves 2, these grooves delimiting three intermediate ribs 3 and two edge ribs 4 at the axial ends of the tread. These ribs 3, 4 are also provided with grooves or incisions 31, 32, 41, 42 of a width that is narrow by comparison with the widths of the circumferential grooves 2. These additional grooves or incisions are, in this case, directed obliquely with respect to the circumferential direction embodied by the direction XX' in FIG. 1.

Figure 2:
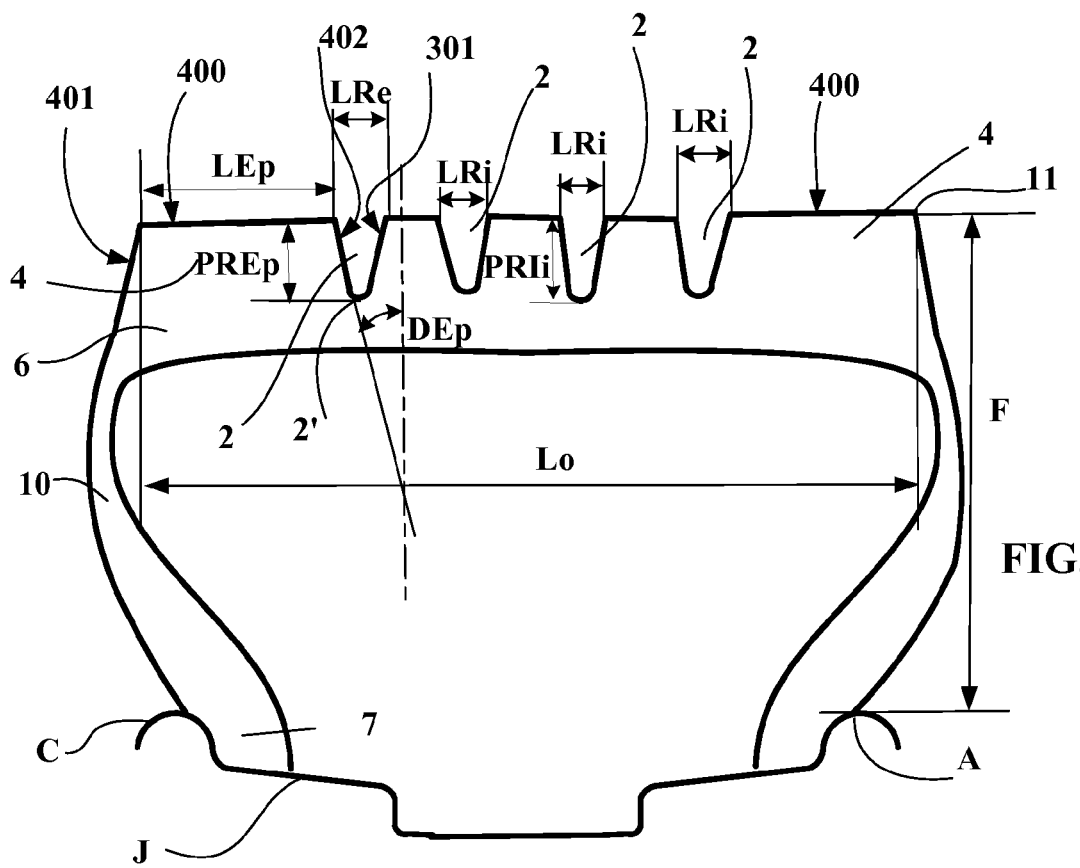
FIG. 2 is a view in section of a tire built using the method of the invention.

FIG. 2 partially shows the tire of FIG. 1 seen in section on a plane containing the axis of rotation YY' of the tire. This tire comprising beads 7 resting on a mounting rim J, the latter comprising parts axially on the outside forming rim flange C. In this section it may be seen that this tire comprises sidewalls 10 extending the beads 7 and extending radially beyond the rim flanges C, these sidewalls being joined together by a crown part 6. This crown part of the tire is provided radially on the outside with the tread 1 the tread pattern of which has been shown in FIG. 1. This tire has a nominal sidewall height F equal to the distance measured in the radial direction separating the axially outside edge 11 of the tread and the radially outermost point A of the mounting rim J in the plane of section of FIG. 2.

This FIG. 2 shows that each edge rib 4 comprises a contact surface 400 intended to come into contact with the road surface during running and two lateral walls 401, 402 intersecting the contact surface at ridges, one of these lateral walls, known as the internal lateral wall 402, delimiting, with a lateral wall 301 opposite belonging to an adjacent intermediate rib 3, a groove 2 of width LRE. This groove 2 has a depth PREp measured between the bottom 2' of the groove and the contact surface 400 of the edge rib 4. This measurement PREp corresponds to the height of the edge rib 4. In this particular instance, the edge and intermediate ribs are all substantially at the same level, which means to say that none of the contact surfaces of the said ribs is offset in the radial direction in comparison with the contact surfaces of at least one other rib. Were they to be offset, the heights PREp, PRi of each lateral wall of each edge and intermediate rib would need to be considered individually. Each edge rib has a width LEp and the intermediate ribs have a width Li which is substantially identical to and less than the width LEp.

The mean angle of inclination of the lateral wall of the edge rib in the plane of section of FIG. 2 is denoted Dep.

The method according to the invention has been applied in order to determine the dimensional parameters of this tire of size 315/80 R22.5.

For this tire, the maximum axial width Lo of the tread is equal to 315 mm, and the aspect ratio H/S is equal to 0.80. Knowing that the height of the flange for the rim on which this tire is mounted is standardized and equal to 12.5 mm, it is possible to obtain a value for the parameter F:

$$F = \text{ROUNDED}\left[\frac{315 \times 80}{100} - 12.7\right] = \text{ROUNDED}[239.3] = 239 \text{ mm}$$

For the tire according to the invention, the grooves 2 have a width equal to 14 mm, the intermediate ribs 3 have widths equal to 30 mm and the grooves, with the exception of the grooves delimiting the edge ribs 4, have depths equal to 16.2 mm. The angle of the lateral walls 301 of the intermediate ribs is equal to 13°.

A reference tire of the prior art, of the same size 315/80R22.5 XZE2+, yields the following dimensions: LEp=47 mm, DEp=15.7° and PREp=16.2 mm.

Calculating P(LEp, DEp, PREp) for this tire of the prior art yields P=312.514697. This result exceeds the set maximum limit which in the case of this tire of the prior art is equal to 264.2788462.

Use of the method according to the invention involves increasing the axial width LEp of each shoulder rib, this width LEp being considered equal to 57 mm while keeping the values of Dep and PRep of the reference tire. This then yields P=261.367467, which satisfies the relationship of the invention, namely P(LEp, DEp, PREp)<1.105769231×F.

In an intermediate step, if the widening of the shoulder rib had been limited for example to 52 mm, then a P value of 288.254857 does not satisfy the desired inequality. It then becomes necessary to reduce the depth of the grooves, which means to reduce the height of the lateral wall of the edge ribs. If the decision is taken to reduce the depth of the tread pattern by 2 mm, PREp equals 14.2 mm. This then gives a P value of 266.335232, which still does not satisfy the desired inequality. It is then necessary to increase the wall angle of the shoulder rib to a DEp value equal to 19° in order to satisfy the criterion; this then yields the P value of 263.52595 which does indeed satisfy the inequality P(LEp, DEp, PREp) <1.105769231×F.

Figure 3:
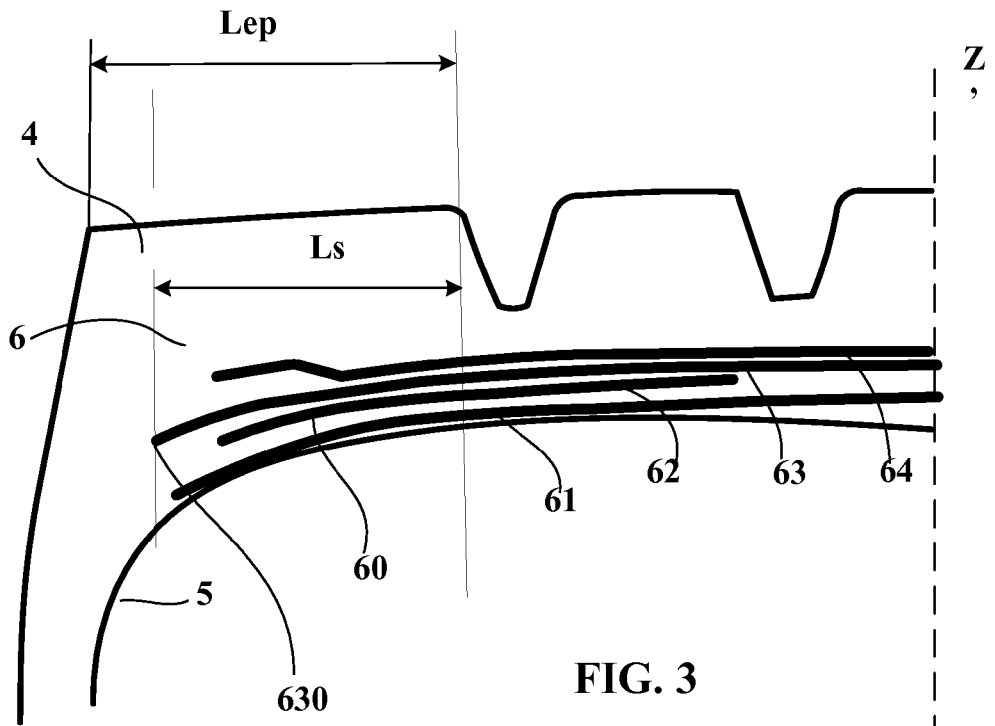
FIG. 3 shows an alternative form of a tire built according to the invention and in which the crown reinforcement is extended radially under the edge ribs.

FIG. 3 shows another alternative form of tire according to the invention, this tire comprising a carcass reinforcement 5 surmounted radially on the outside by a crown reinforcement 60 itself surmounted radially on the outside by a tread 1 that satisfies the inequality relationship P(LEp, DEp, PREp) <1.105769231×F.

Furthermore, the crown reinforcement 60 comprises several reinforcer plies 61, 62, 63, 64, at least one of these reinforcer plies having a greater axial width than the others. In this particular instance, it is the third of these plies 63 which is of greater axial width.

Advantageously, the axially outer end 630 of the axially widest reinforcer ply 63 of the crown reinforcement is at a distance from the equatorial plane, having the line PP' as its plot in the plane of section, which is greater than the axial distance separating the axially outermost groove from that same equatorial plane so that the distance between the end of the axially outermost ply and the interior edge of the shoulder rib is at least equal to 75% of the total width of the shoulder rib LEp. In the instance shown in FIG. 3, the width Ls of crown reinforcement radially under the edge rib is at least equal to 75% of the width LEp of the shoulder rib.

Figure 4:
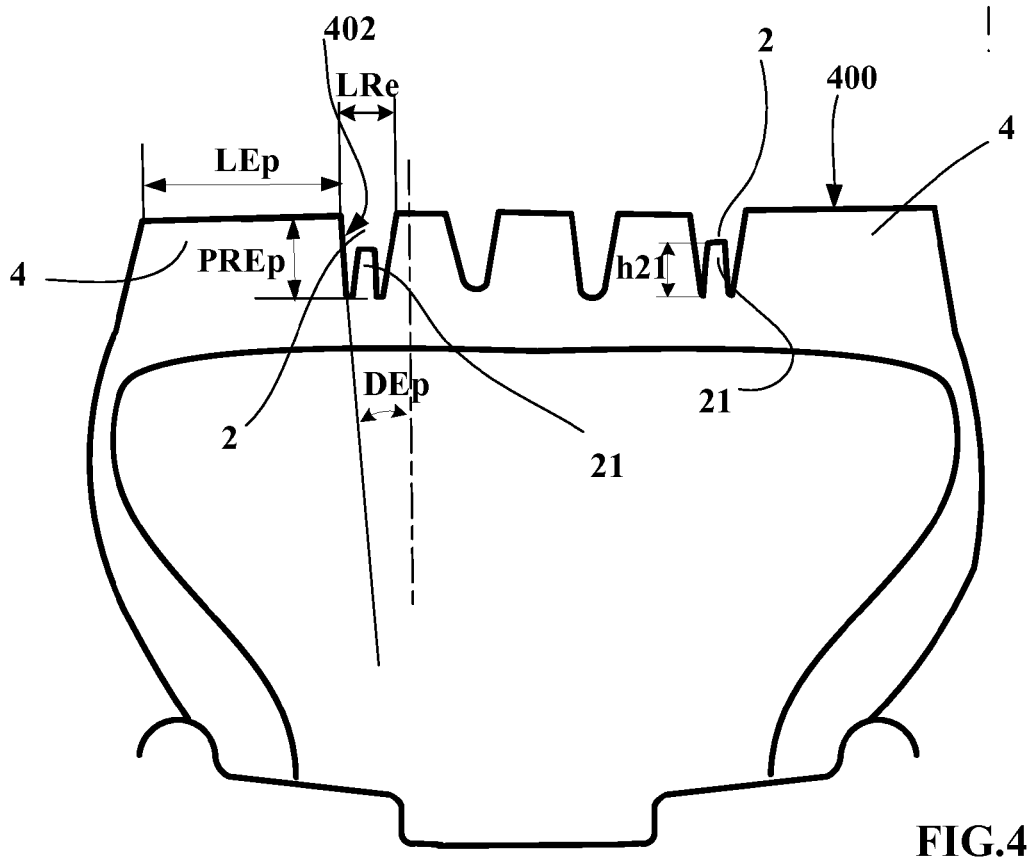
FIG. 4 is a section through an alternative form of a tire according to the invention, this tire having protective protrusions in the groove bottoms.

FIG. 4 is a section through an alternative form of a tire according to the invention, this tire comprising protective protrusions in the bottom of the grooves to prevent objects such as stones from entering the edge grooves and being unable to escape and thus progressively dig into the bottom of the grooves and more particularly the bottom of the edge grooves. It will be readily appreciated that such digging-in will increase the proneness of the groove bottoms to breakage.

As can be seen from FIG. 4 which is a partial section of a tire according to the invention, in the two edge grooves 2 there are protrusions 21, here circumferentially discontinuous, these protrusions 21 having a height h21 equal to 60% of the height PRep of the edge ribs 4 and a width, measured on its part radially furthest from the axis of rotation, equal to half the width LRe of the groove delimited by the edge rib.

The inequality relation P(LEp, DEp, PREp) <1.105769231×F is satisfied here for an angle of inclination DEp of the internal lateral wall 402 of the edge rib which is preferably limited to at most 6 degrees. Thanks to this angular limit the protrusions have a suitable rigidity. Each protrusion may have lateral walls delimiting it which are inclined by an angle at most equal to 6 degrees in order to increase the flexural rigidity of these protrusions.

The invention is not restricted to the examples described and depicted and various modifications can be made thereto without departing from its scope.

The invention claimed is:

1. A tire adapted to be fitted to the steered axle of a heavy goods vehicle, comprising:
   beads intended to be in contact with a rim on which the tire is mounted,
   sidewalls extending the beads and having a nominal sidewall height F,
   a crown region where the sidewalls meet,
   a tread surmounting the crown region and adapted to come into contact with the road surface during running, and
   a crown reinforcement comprising at least two superposed reinforcer plies,
   wherein the tread in the new state has a maximum width Lo for contact with the ground under conventional conditions of use,
   wherein the tread comprises at least four circumferential grooves each having a width and each extending between a surface of the tread and a groove bottom,
   wherein these circumferential grooves delimit three intermediate ribs and two edge ribs axially bounding the tread,
   wherein each edge rib has two lateral walls,
   wherein one of these lateral walls, known as the internal lateral wall, has a height PREp measured with respect to the bottom of the circumferential groove delimiting the edge rib,
   wherein this internal lateral wall has, when viewed in section on a plane containing the axis of rotation, an angle of inclination DEp,
   wherein this angle of inclination is such that points of this lateral wall that are radially furthest inwards are closer to an equatorial plane of the tire that is perpendicular to the axis of rotation of the tire and passing through the points of the tire that are radially furthest away from the axis of rotation than points of the same lateral wall that are radially outermost,
   wherein each edge rib has a width LEp greater than a width of each of the intermediate ribs,
   wherein the width of the edge rib LEp, the angle of inclination of the lateral wall of an edge rib DEp, and the height PREp of the internal lateral wall of the edge rib satisfy the relationship:

$P(LEp, DEp, PREp) < 1.105769231 \times F$, where the value of P(LEp, DEp, PREp) is obtained by making the following calculation:

$$P(LEp, DEp, PREp) = \\ -303.528 - 2.00675 \times LEp + 10.2755 \times DEp + 81.0414 \times PREp - \\ 0.052551 \times LEp^2 - 0.0825991 \times LEp \times DEp + 0.225564 \times LEp \times PREp - \\ 0.111262 \times DEp^2 - 0.209215 \times DEp \times PREp - 2.5831 \times PREp^2,$$

wherein the tire can travel an increased distance before onset of tramlining wear, or an increased distance before vibrations connected with uneven wear at the tread edges, or both, with respect to a tire having different values for LEp, PREp, and DEp.

2. The tire according to claim 1 wherein the width Lep of each edge rib is chosen so as to be at least 1.85 times greater than the width of any other intermediate rib.

3. The tire according to claim 2, wherein an axially outer end of an axially widest ply of the crown reinforcement is at a distance from the equatorial plane that is greater than an axial distance separating an axially outermost circumferential groove from that same equatorial plane, such that the distance between the axially outermost ply end and an inner edge of the edge rib is at least equal to 75% of the total width of the edge rib LEp.

4. The tire according to claim 1, wherein the width of each circumferential groove, measured on the tread surface in the new state, is at least equal to 3% of the total width Lo of the tread.

5. The tire according to claim 1 wherein the angle of inclination DEp of the internal lateral wall of the edge rib and the angle of inclination of the wall opposite this internal lateral wall are such that the sum of these two angles is greater than or equal to 26 degrees.

6. The tire according to claim 5 wherein the angle of inclination DEp of the internal lateral wall of the edge rib varies continuously from a minimum value that satisfies the relationship P(LEp, DEp, PREp)<1.10576921×F, this value remaining greater than or equal to 10 degrees.

7. The tire according to claim 1, wherein each circumferential groove delimited by an edge rib comprises a plurality of protrusions of a height at least equal to 50% of the height PREp of the edge rib and of a width at least equal to 50% of a width LRe of the circumferential groove delimited by the edge rib, and wherein the angle of inclination DEp is at most equal to 6 degrees.

* * * * *